US010340842B2

(12) United States Patent
Brown

(10) Patent No.: US 10,340,842 B2
(45) Date of Patent: Jul. 2, 2019

(54) MULTI-ORTHOGONAL PHOTONIC ENERGY COLLECTION SYSTEM

(71) Applicant: Jesse Timron Brown, Elmhurst, NY (US)

(72) Inventor: Jesse Timron Brown, Elmhurst, NY (US)

(73) Assignee: Jesse Timron Brown, Maspeth, NY (US)

( * ) Notice: Subject to any disclaimer, the term of this patent is extended or adjusted under 35 U.S.C. 154(b) by 1017 days.

(21) Appl. No.: 14/561,206

(22) Filed: Dec. 4, 2014

(65) Prior Publication Data
US 2015/0311860 A1  Oct. 29, 2015

Related U.S. Application Data

(60) Provisional application No. 61/911,466, filed on Dec. 4, 2013.

(51) Int. Cl.
*H02S 40/22* (2014.01)
*H01L 31/0352* (2006.01)

(52) U.S. Cl.
CPC ........ *H02S 40/22* (2014.12); *H01L 31/03529* (2013.01); *Y02E 10/52* (2013.01)

(58) Field of Classification Search
CPC ..................... H01L 31/00–31/78; H02S 40/22
See application file for complete search history.

(56) References Cited

U.S. PATENT DOCUMENTS 8,026,439 B2 * 9/2011 Guha ....................... F24J 2/067
  136/256
2009/0314343 A1 * 12/2009 Okaniwa ........... H01L 31/02168
  136/256

* cited by examiner

*Primary Examiner* — Shannon M Gardner

(57) ABSTRACT

A method of energy collection using a set of collecting manifolds or surfaces such as solar cells immersed into a refracting matrix. The combination of the surfaces and matrix into a module forms the system.

6 Claims, 2 Drawing Sheets

Another Possible Topology

A coiled cell surface allowing for
greater surface area per unit volume

MULTI-ORTHOGONAL PHOTONIC ENERGY COLLECTION SYSTEM

CROSS-REFERENCE TO RELATED APPLICATIONS

This application is the non-provisional continuation of the provisional patent application No. 61/911,466.

BACKGROUND OF THE INVENTION

Currently Solar Energy Collection involving solar panels is usually accomplished by placing solar panels in an array such that the surface of the panel is orthogonal to the incident rays from the sun. Therefore maximizing energy collection requires maximizing the surface area used.

BRIEF DESCRIPTION OF THE DRAWINGS

There are two attached drawings with this application.

Drawing FIG. 1 gives the basic design of a energy collection module with solar cells in an upright position while immersed in the refracting medium.

Drawing

DESCRIPTION

Figure 1:
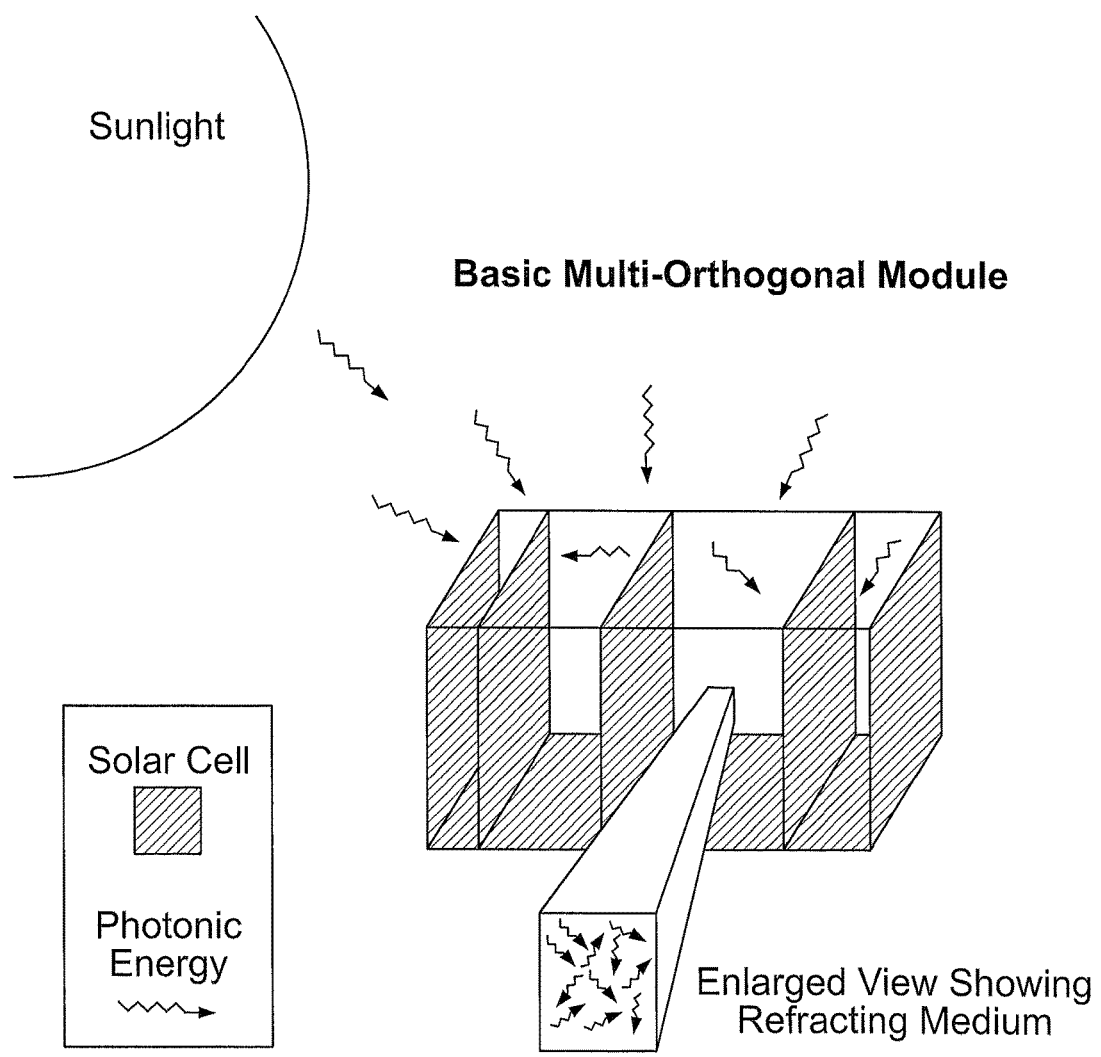
Figure 2:
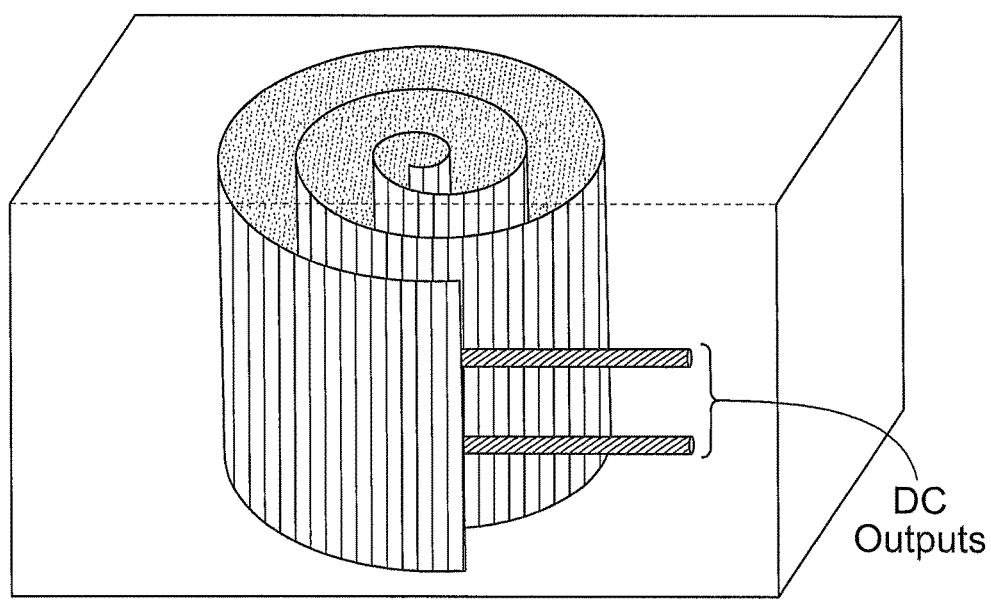
FIG. 2 shows an alternate arrangement or topology of a coiled solar cell in the medium. These are not the only possible arrangements (topologies). These basic drawings should be relatively self explanatory due to the basic nature of the invention.

This invention takes the energy collection space from a 2-Dimensional surface to a 3-Dimensional space by placing collecting surfaces into a refractive medium thereby creating a potential for much greater collecting surface area. Theoretically it is only limited by the potential of miniaturization and integration of the collecting surface topology in the refractive matrix.

The refractive matrix would be a material which refracts light in all directions such that the orientation of the surfaces does not need to be incident to classical light rays from the sun but only embedded in the emitting matrix.

The module would have to be voluminous enough to allow for the integrated matrix and collection manifolds. The Volume could be decreased according to miniaturization of the collection manifold. The image shows the basic example with rigid surfaces. Non-rigid surface would allow for larger collecting surface area.

The model used for the prototype used silicon solar cells in a $CO_2$ gas matrix with a clear top. The solar cells were parallel to the incident sunlight. A significant increase in voltage output was achieved.

Notes:

By Matrix we mean a substance or mixture of substances in the volume of the module.

By dimension we simply mean the normal linear visually obvious dimensionality of everyday geometry down to the visually optical level.

Let N be any integer number.

What is claimed is:

1. A solar cell module for collecting incident light, comprising:

A housing with a clear top;

A solar cell within the housing and including at least one collection surface that is oriented normal to the clear top; and A refracting medium provided within the housing and surrounding the solar cell, the refracting medium refracts incident light entering the module in all directions within the refracting medium, Wherein the solar cell comprises a coiled configuration including the at least one collection surface extending along the length thereof.

2. The solar cell module of claim 1, wherein the refracting medium comprises $CO_2$.

3. The solar cell module of claim 1, wherein the refracting medium comprises a mixture of at least two different types of refracting medium.

4. A method of manufacturing a solar cell module, comprising:

Providing a solar cell within a housing having a clear top; the solar cell including at least one collection surface normal to the clear top; and Providing a refracting medium within the housing for refracting incident light entering the module in all directions within the volume of the refracting medium, Wherein the solar cell comprises a coiled configuration including at least one collection surface extending along the length thereof.

5. The method of claim 4, wherein the refracting medium comprises $CO_2$.

6. The method of claim 4, wherein the refracting medium comprises a mixture of at least two different types of refracting medium.

* * * * *